United States Patent
Shi et al.

(10) Patent No.: US 10,707,562 B2
(45) Date of Patent: Jul. 7, 2020

(54) SYSTEM AND METHOD FOR ADAPTIVE APERTURE TUNABLE ANTENNA

(71) Applicant: Futurewei Technologies, Inc., Plano, TX (US)

(72) Inventors: Ping Shi, San Diego, CA (US); Navid Nader, San Diego, CA (US)

(73) Assignee: Futurewei Technologies, Inc., Plano, TX (US)

( * ) Notice: Subject to any disclaimer, the term of this patent is extended or adjusted under 35 U.S.C. 154(b) by 284 days.

(21) Appl. No.: 14/861,744

(22) Filed: Sep. 22, 2015

(65) Prior Publication Data
US 2017/0084989 A1  Mar. 23, 2017

(51) Int. Cl.
*H01Q 1/24* (2006.01)
*H04B 1/04* (2006.01)

(52) U.S. Cl.
CPC .......... *H01Q 1/245* (2013.01); *H01Q 1/243* (2013.01); *H04B 1/0475* (2013.01); *H03J 2200/06* (2013.01); *H04B 2001/045* (2013.01)

(58) Field of Classification Search
CPC .......... H01Q 1/243–245; H01Q 13/103; H03J 2200/06
See application file for complete search history.

(56) References Cited

U.S. PATENT DOCUMENTS

| | | | |
|---|---|---|---|
| 6,456,856 B1 | 9/2002 | Werling et al. | |
| 8,971,826 B2 * | 3/2015 | Abdul-Gaffoor | H03K 17/955 455/77 |
| 9,190,712 B2 | 11/2015 | Hu et al. | |
| 9,374,113 B2 * | 6/2016 | Greene | H04B 1/18 |
| 10,141,655 B2 * | 11/2018 | Desclos | H01Q 21/0006 |
| 2005/0057399 A1 | 3/2005 | Kipnis et al. | |
| 2011/0012793 A1 | 1/2011 | Amm et al. | |
| 2011/0105023 A1 | 5/2011 | Scheer et al. | |
| 2011/0241797 A1 | 10/2011 | Shana'a et al. | |
| 2012/0119842 A1 | 5/2012 | Gu et al. | |
| 2013/0217342 A1 | 8/2013 | Abdul-Gaffoor et al. | |

(Continued)

FOREIGN PATENT DOCUMENTS

CN    101233653 A    7/2008
CN    102590867 A    7/2012

(Continued)

OTHER PUBLICATIONS

Meng, F., et al., "A Mismatch Detector for Adaptive Antenna Impedance Matching," 36th European Microwave Conference, Sep. 10-15, 2006, pp. 1457-1460.

(Continued)

*Primary Examiner* — Daniel Munoz
*Assistant Examiner* — Amal Patel
(74) *Attorney, Agent, or Firm* — Slater Matsil, LLP

(57) ABSTRACT

An antenna's resonance frequency is detuned when a part of a human body approaches or contacts the antenna and consequently results in efficiency loss. The antenna may be tuned by changing its total load capacitance such that the antenna's total load capacitance falls within a reference capacitance range of a reference capacitance, where the antenna can operate at or near its pre-determined operating resonance frequency. A tunable capacitor may be coupled to the antenna for tuning the total load capacitance of the antenna.

23 Claims, 8 Drawing Sheets

(56) References Cited

U.S. PATENT DOCUMENTS

| | | |
|---|---|---|
| 2013/0310106 A1 | 11/2013 | Wang et al. |
| 2014/0071008 A1 | 3/2014 | Desclos et al. |
| 2014/0187178 A1 | 7/2014 | Yang et al. |
| 2014/0375514 A1 | 12/2014 | Bakalski et al. |
| 2015/0119052 A1 | 4/2015 | Caimi et al. |
| 2015/0311881 A1 | 10/2015 | Nagumo et al. |
| 2017/0018841 A1* | 1/2017 | Parkhurst ............... H01Q 1/245 |
| 2017/0310298 A1 | 10/2017 | Nagumo et al. |

FOREIGN PATENT DOCUMENTS

| | | |
|---|---|---|
| CN | 103069715 A | 4/2013 |
| CN | 104137331 A | 11/2014 |
| CN | 104137332 A | 11/2014 |
| CN | 104221215 A | 12/2014 |
| CN | 104242976 A | 12/2014 |
| CN | 104604025 A | 5/2015 |
| JP | 2008517568 A | 5/2008 |
| WO | 0147063 A1 | 6/2001 |
| WO | 2013132972 A1 | 9/2013 |
| WO | 2015157087 A1 | 10/2015 |

OTHER PUBLICATIONS

Song, H., et al., "Automatic Antenna Tuning Unit for Software-Defined and Cognitive Radio," IEEE Antennas and Propagation Society International Symposium, Jun. 9-15, 2007, pp. 85-88.

\* cited by examiner

| STATE NUMBER | DETECTED CAPACITANCE Cnx | TUNING CAPACITANCE Cnew |
|---|---|---|
| 1 | C1x | C1 |
| 2 | C2x | C2 |
| 3 | C3x | C3 |
| ⋮ | ⋮ | ⋮ |
| N-1 | CN-1x | CN-1 |
| N | CNx | CN |

SYSTEM AND METHOD FOR ADAPTIVE APERTURE TUNABLE ANTENNA

TECHNICAL FIELD

The present disclosure relates generally to antenna systems and, in particular embodiments, to a system and method for adaptive aperture tunable antennas.

BACKGROUND

Antennas are important components of equipment that performs wireless communication. They are widely used in systems such as radio broadcasting, broadcast televisions, two-way radios, communications receivers, wireless computer networks, cell phones, and satellite communications, as well as other devices such as garage door openers, wireless microphones, Bluetooth-enabled devices, walkie-talkies, baby monitors, and RFID tags on merchandise. As communications technologies advance, antenna design is facing new challenges such as requirements of supporting multiband and multimode services, supporting additional frequency bands using wideband code division multiplexing access (WCDMA) and 3GPP Long Term Evolution (LTE), supporting more radio access technologies and thinner ID.

When a part of a human body, such as head or a hand, approaches or contacts an antenna of a hand-held communication device, such as a smart phone or a tablet, the antenna experiences reduced system efficiency, which degrades performance. The performance degradation is especially serious for antennas within a metal housing or chassis. The efficiency loss may be compensated by utilizing antenna tuning methods. Conventional antenna tuning methods monitor changes on an antenna's impedance, using phase or voltage standing wave ratio (VSWR), and seek to match the antenna's impedance to that of the antenna feed line. These methods rely on the transmitter to measure the VSWR or phase of a matched antenna to do closed loop control and the tuning may not be optimal when transmitting power is low.

SUMMARY OF THE INVENTION

Technical advantages are generally achieved, by embodiments of this disclosure which describe a system and method for adaptive aperture tunable antennas.

In accordance with an embodiment, an apparatus is provided which includes an antenna, a tunable capacitor coupled to the antenna, a capacitance sensing device coupled to the antenna, and a controller coupled to the capacitance sensing device. The capacitance sensing device is configured to detect a total load capacitance of the antenna. The controller is configured to determine a tuning capacitance used for tuning the tunable capacitor according to the detected total load capacitance and a reference capacitance, and to control the tuning of the tunable capacitor in accordance with the tuning capacitance so that the total load capacitance of the antenna remains within a reference capacitance range of the reference capacitance.

In accordance with another embodiment, a method is provided. The method detects a total load capacitance of an antenna, and changes the total load capacitance of the antenna according to the detected total load capacitance of the antenna and a reference capacitance so that the total load capacitance of the antenna remains within a reference capacitance range of the reference capacitance. The method may further couple a tunable capacitor to the antenna, and tune the tunable capacitor according to the detected total load capacitance of the antenna and the reference capacitance so that the total load capacitance of the antenna remains within the reference capacitance range of the reference capacitance.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

When a part of a human body, such as a hand, is approaching or contacting an antenna which operates at a pre-determined operating resonance frequency with respect to a particular frequency band and a particular access technology, a total load capacitance of the antenna will change since the part of the human body forms a capacitance load to the antenna, which causes the antenna's resonance frequency to deviate from the pre-determined operating resonance frequency. As a result, the antenna's efficiency is reduced at its pre-determined operating resonance frequency.

Aspects of the present disclosure provide an antenna system including an antenna, a tunable capacitor coupled to the antenna, a capacitance sensing device coupled to the antenna, and a controller coupled to the capacitance sensing device and a tunable capacitor. The antenna system monitors the antenna's total load capacitance, and when the total load capacitance changes, the antenna system may adjust the total load capacitance of the antenna by tuning the tunable capacitor, so that the total load capacitance of the antenna remains within a reference capacitance range of a reference capacitance, where the antenna can operate at or near its pre-determined operating resonance frequency offering generally higher system efficiency.

Figure 1A:
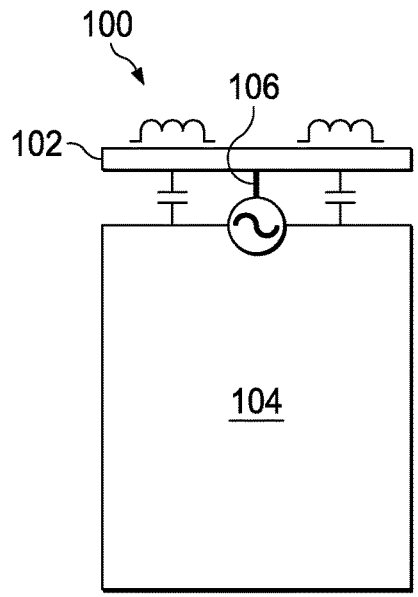
FIG. 1A illustrates a schematic diagram of an embodiment antenna system.
Figure 1B:
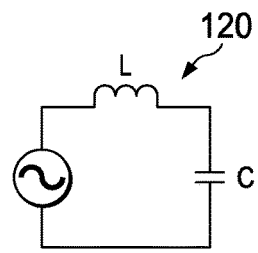
FIG. 1B illustrates a schematic diagram of a circuit modeling the antenna system depicted in FIG. 1A.

FIG. 1A illustrates a schematic diagram of an embodiment antenna system 100. The antenna system 100 includes an antenna 102 coupled to a chassis ground 104 through an antenna feed point 106. The antenna system 100 may be included in a hand-held communication device, such as a cell phone. The antenna system 100 may be modeled by an electronic circuit 120 in FIG. 1B, which includes an inductor L and a capacitor C coupled in series. The capacitor C represents the equivalent capacitance value of the antenna 102 according to the antenna characteristics. When the hand-held communication device is in free space, which means that there is no interaction between a part of a human body and the hand-held communication device, and the device antenna is not electrically loaded by any other object in proximity, such as when a cell phone is placed on top of a foam on a wood table without a human body around, the total load capacitance of the antenna 102 is about the same as the capacitance of the capacitor C. The antenna 102 is generally designed to operate at a pre-determined operating resonance frequency based on its capacitance and inductance, which generally maximizes its system efficiency. The total load capacitance herein refers to the capacitance between the antenna 102 and the chassis ground 104. The interaction of a part of a human body with the hand-held communication device herein refers to different use cases of the hand-held radio communication device, such as the device is held by a left hand, a right hand, or in a pocket, the device is held by a left hand near the head, the device is held by a left hand with a right hand swiping on the screen of the device.

Figure 1C:
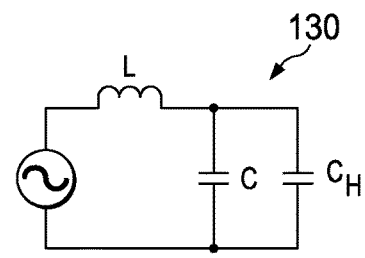
FIG. 1C illustrates a schematic diagram of another circuit modeling the antenna system depicted in FIG. 1A.

When a part of a human body approaches or contacts the hand-held communication device, and consequently, the antenna 102, the capacitance between the antenna 102 and the chassis ground 104 will increase because the part of the human body forms a capacitance load to the antenna 102. In this case, the antenna 102 may be modeled by a circuit 130 in FIG. 1C. The circuit 130 includes a human load capacitor $C_H$ and a capacitor C of the antenna 102 coupled in parallel, which are further coupled to an inductor L in series. As a result, the total load capacitance of the antenna 102 has increased to ($C_H$+C). The increased total load capacitance of the antenna 102 may cause the resonance frequency of the antenna 102 to deviate from its pre-determined operating resonance frequency and thus cause impedance mismatch loss of the antenna. The antenna here is modeled as an inductor-capacitor (L-C) resonator. The C and L represent equivalent inductance and capacitance values according to antenna characteristics, and are equal to simulated C and L according to the mechanical structure of the antenna. The capacitance of the human load capacitor $C_H$ represents an equivalent loading capacitance to the antenna 102, and may not be equal to a measured human load capacitance or a simulated human load capacitance using an electromagnetic (EM) field simulator. Due to the different ways to place a capacitance sensor to measure the capacitance of an antenna, a conversion between an equivalent loading capacitance to the antenna and the actual measured loading capacitance may be required. Throughout this disclosure, the total load capacitance of an antenna is referred to as a total effective capacitance of the antenna according to the antenna's LC model, and the term "total load capacitance" and the term "total effective capacitance" are used interchangeably.

Figure 1D:
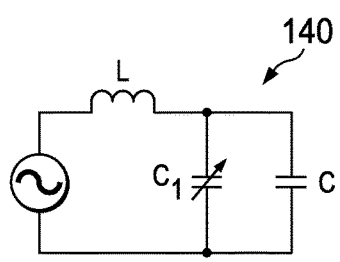
FIG. 1D illustrates a schematic diagram of another circuit modeling the antenna system depicted in FIG. 1A.

In accordance to some embodiments, a tunable capacitor may be coupled to the antenna 102 to adjust the total load capacitance of the antenna 102, in which case the antenna system 100 may be modeled as a circuit 140 as shown in FIG. 1D. The circuit 140 includes a tunable capacitor C1 coupled in parallel to the capacitor C of the antenna 102, which is further coupled to an inductor L in series. The tunable capacitor C1 may be tuned so that the antenna 102, when in free space, has a total load capacitance (C+C1) that allows the antenna to operate at its pre-determined operating resonant frequency. In one embodiment, the tunable capacitor C1 may be pre-tuned so that, theoretically, (C+C1) is equal to a reference capacitance $C_{ref}$. The reference capacitance $C_{ref}$ is a pre-determined capacitance value, and the antenna can operate at a pre-determined operating resonance frequency when the total load capacitance of the antenna is equal to $C_{ref}$. The reference capacitance $C_{ref}$ may vary for different types of antennas, and frequency bands and operating modes that an antenna may support, and may be pre-determined at the production of an antenna. In accordance with some embodiments, the tunable capacitor C1 may be pre-tuned so that (C+C1) is within a reference capacitance range ($C_{ref}-\Delta c$, $C_{ref}+\Delta c$) of a reference capacitance $C_{ref}$, where $\Delta c$ is the maximum acceptable capacitance difference between the total load capacitance of the antenna 102 and the reference capacitance $C_{ref}$. When the total load capacitance of the antenna 102 is within the reference capacitance range, the antenna may operate at or near its pre-determined operating resonance frequency.

Figure 1E:
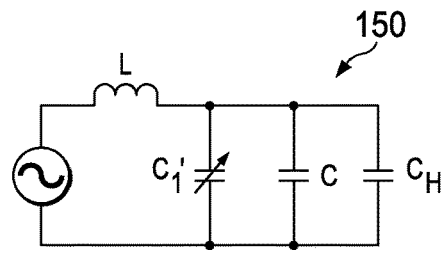
FIG. 1E illustrates a schematic diagram of another circuit modeling the antenna system depicted in FIG. 1A.

When a part of a human body approaches or contacts the antenna 102, the antenna 102 may be represented by a circuit 150 illustrated in FIG. 1E. The circuit 150 includes three capacitors, namely the tunable capacitor C1, the capacitor C, and the human load capacitor $C_H$, coupled in parallel. The three capacitors are then coupled to an inductor L in series. To cancel the impact of the human load capacitance, the capacitance of the tunable capacitor may be tuned from C1 to a different value C1' so that, ideally, (C+C1)=(C+C1'+$C_H$)=$C_{ref}$. In accordance with some embodiments, the capacitance of the tunable capacitor may be tuned from C1 to a different value C1', so that (C+C1'+$C_H$) is within the reference capacitance range ($C_{ref}-\Delta c$, $C_{ref}+\Delta c$) of the reference capacitance $C_{ref}$, where $\Delta c$ is the maximum acceptable capacitance difference between the total load capacitance of the antenna 102 and the reference capacitance $C_{ref}$. The $\Delta c$ may be selected so that when the total load capacitance of the antenna 102 is within the reference capacitance range, the antenna may operate at a resonance frequency that is at or near the antenna's pre-determined operating resonance frequency. $\Delta c$ may be pre-determined or determined on-the-fly according to the efficiency required for the antenna 102, and other related factors such as the methods for tuning the tunable capacitor, and power consumption status of the antenna. Thus, the total load capacitance of the antenna 102 remains within the reference capacitance range, and the antenna 102 is able to operate at a resonance frequency that is at or near its pre-determined operating resonant frequency, achieving a high efficiency even when there are interactions between the antenna 102 and a part of a human body. The tunable capacitor C1 may have a tuning range that can accommodate a minimal and maximal human load capacitance that may be loaded to the antenna 102, and the tuning range of the tunable capacitor C1 may have a minimum tunable capacitance and a maximum tunable capacitance. In one embodiment, the minimum tunable capacitance should be less than the capacitance required to make the antenna resonate at or near its pre-determined operating resonance frequency with maximal human body loading to antenna, while the maximum tunable capacitance should be greater than the capacitance that allows the antenna to resonate at or near its pre-determined operating resonance frequency when no human body load exists.

Figure 2:
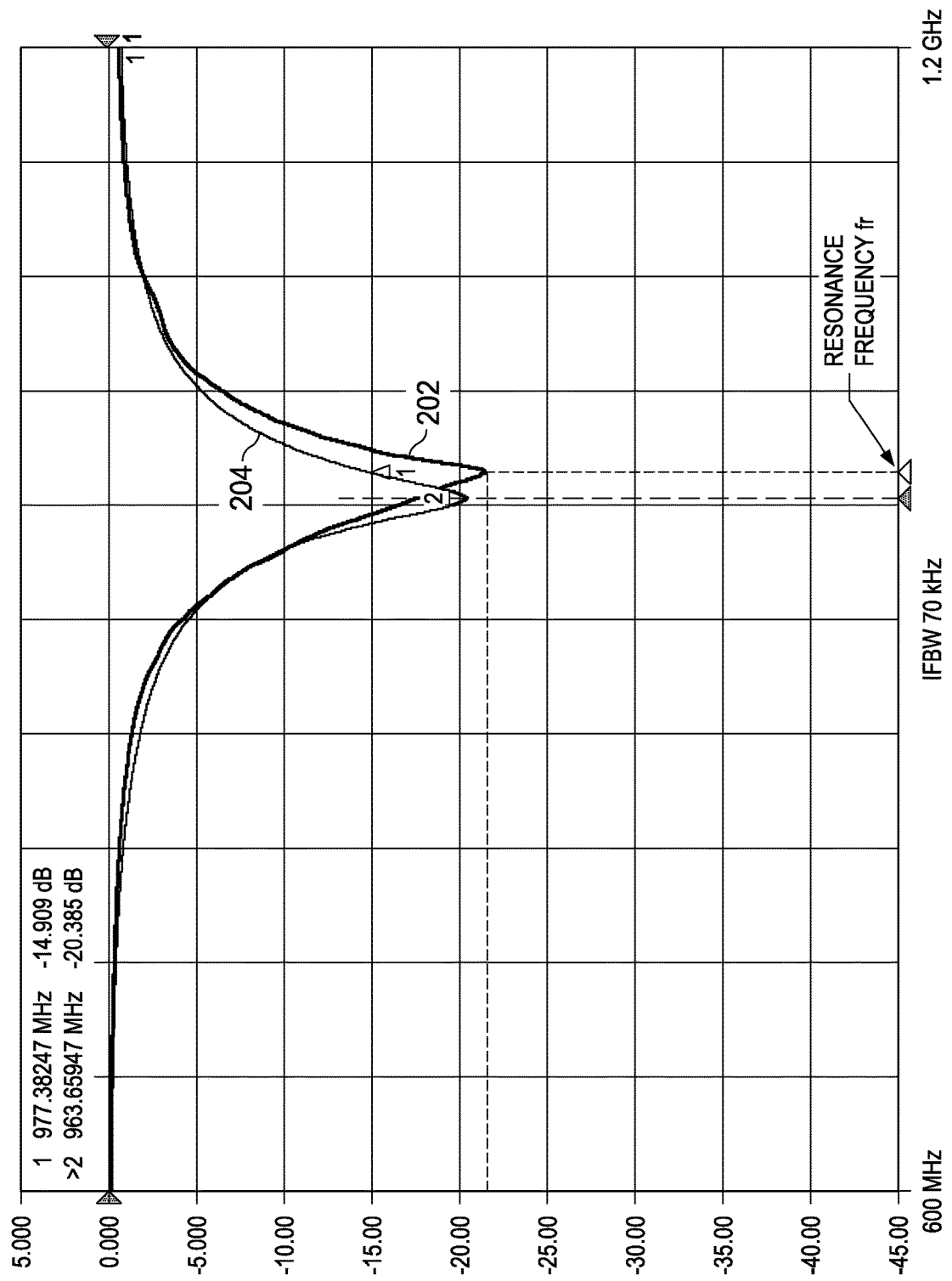
FIG. 2 illustrates a graph of an antenna's return loss varying with frequencies.
Figure 3:
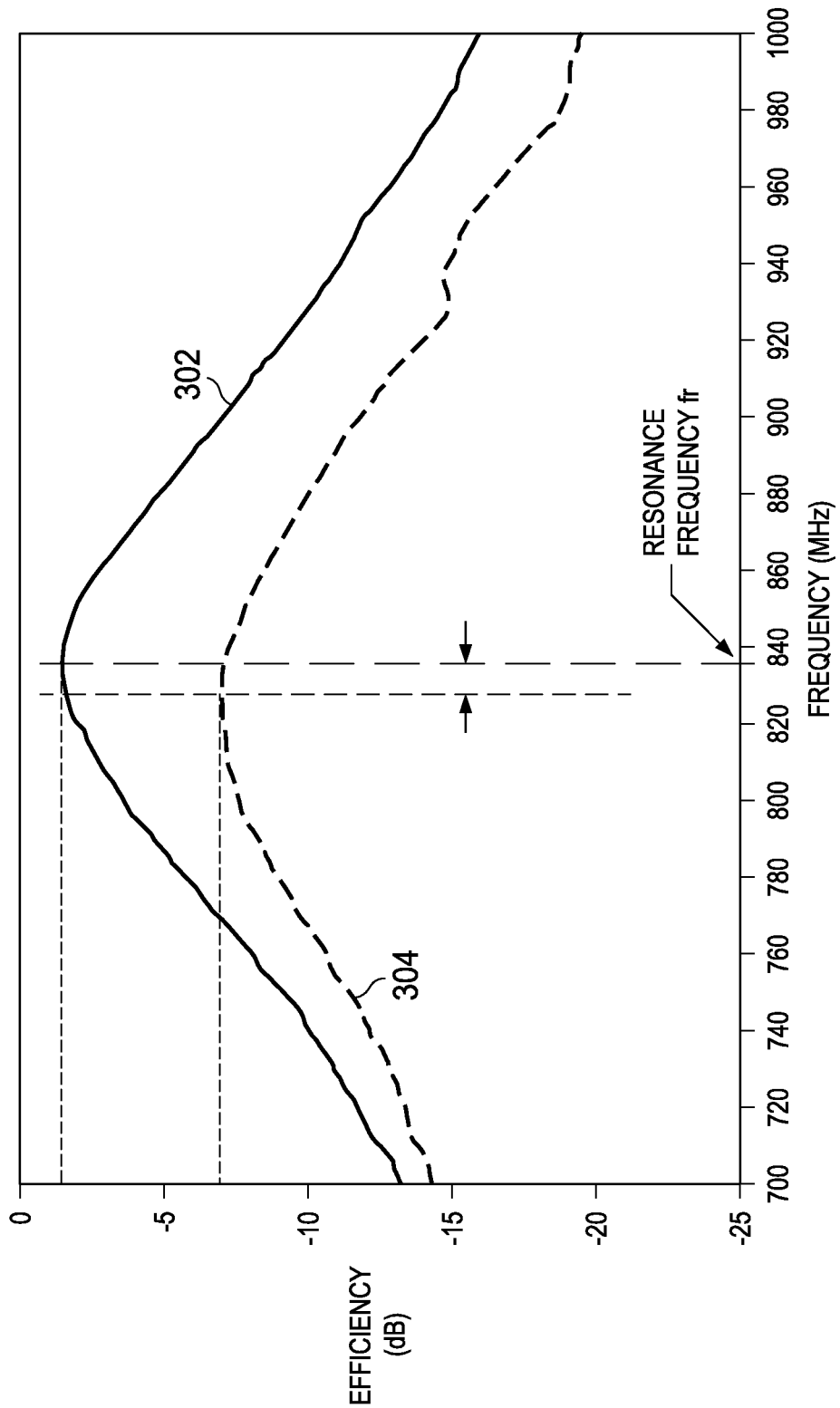
FIG. 3 illustrates a graph of an antenna's efficiency varying with frequencies.

FIG. 2 illustrates a graph of return loss of an antenna of a hand-held communication device varying with respect to frequencies according to one embodiment of the present disclosure. The horizontal axis of FIG. 2 represents frequency and the vertical axis represents return loss of the antenna. Curve 202 shows the return loss of the antenna when the antenna is in free space, and curve 204 shows the return loss of the antenna when the hand-held communication device is held by a hand. As shown, at the antenna's operating resonance frequency fr, the antenna has a return loss about −22 dB. When the device is held by a hand, the antenna's resonance frequency is deviated from the resonance frequency fr, i.e., decreased by approximately 12 MHz. As shown by curve 204, the decrease of the resonance frequency consequently decreases its power efficiency at its pre-determined operating resonance frequency, where the return loss is increased to about −15 dB FIG. 3 illustrates a graph of efficiency of an antenna of a hand-held communication device varying with respect to frequencies according to one embodiment of the present disclosure. The horizontal axis of FIG. 3 represents frequency and the vertical axis represents system efficiency of the antenna. Curve 302 shows the efficiency of the antenna when the antenna is in free space, and curve 304 shows the efficiency of the antenna when the hand-held communication device is held by a hand. As shown, at the antenna's resonance frequency fr, the antenna has efficiency of about −2 dB. However, when the device is held by a hand, the antenna's resonance frequency is decreased by approximately 12 MHz, and the antenna's peak efficiency is also dropped to about −7 dB.

Figure 4:
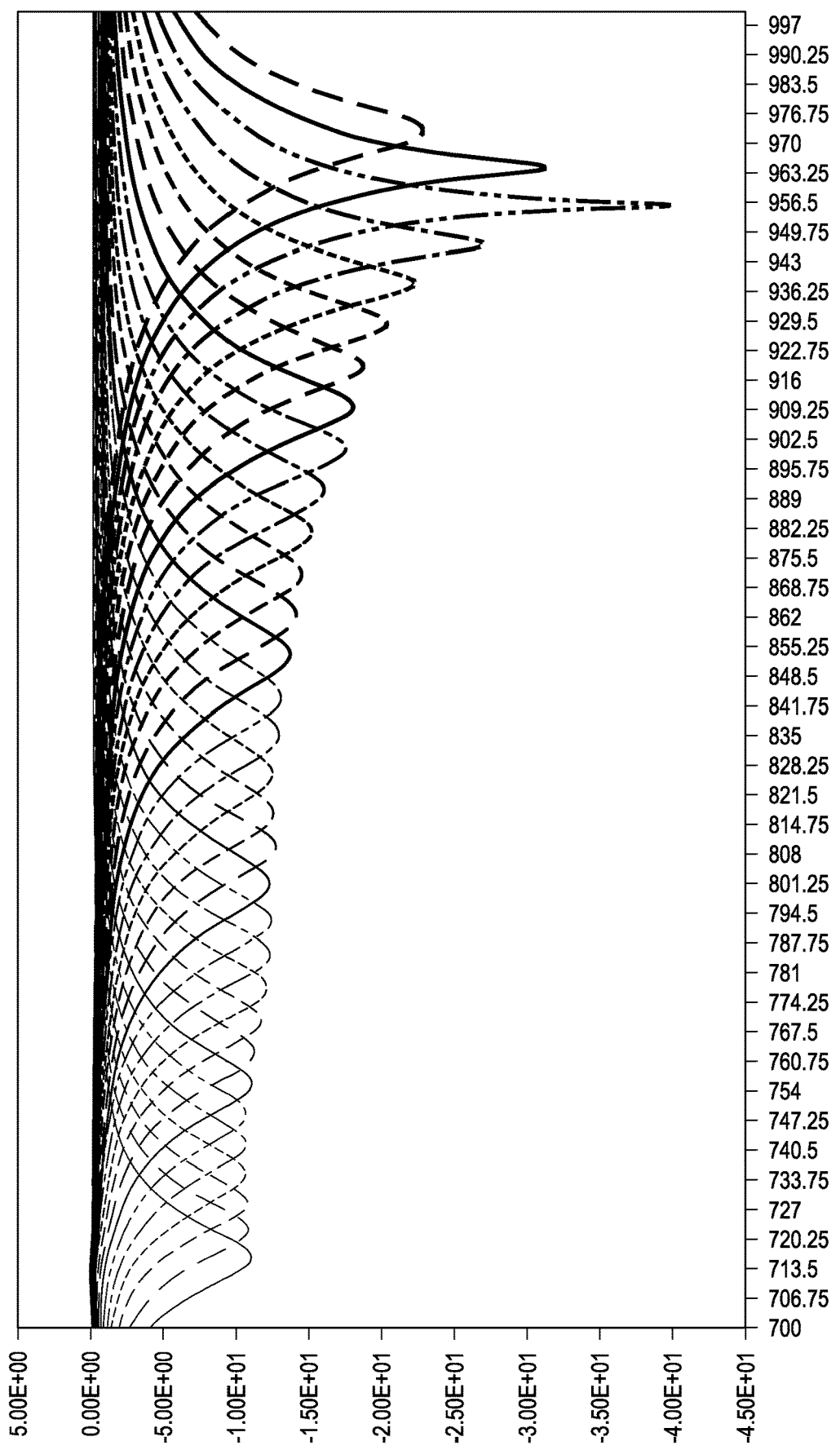
FIG. 4 illustrates another graph of an antenna's return loss varying with frequencies.

FIG. 4 illustrates a graph of return loss of an antenna of a hand-held communication device varying with respect to frequencies according to one embodiment of the present disclosure. The horizontal axis of FIG. 4 represents frequency and the vertical axis represents return loss of the antenna. FIG. 4 illustrates a plurality of curves, and each represents a relationship between the return loss and the frequency with respect to a particular total load capacitor of the antenna. The total load capacitor of the antenna is changed by tuning a tunable capacitor coupled to the antenna. As shown, the antenna's resonance frequency varies with its total load capacitance. Thus, by adaptively changing the total load capacitor of the antenna through a tunable capacitor, the antenna's resonance frequency may be tuned, and consequently the aperture of the antenna is tuned adaptively, which results in an improved system efficiency of the antenna when a part of a human body interacts with the antenna.

Figure 5:
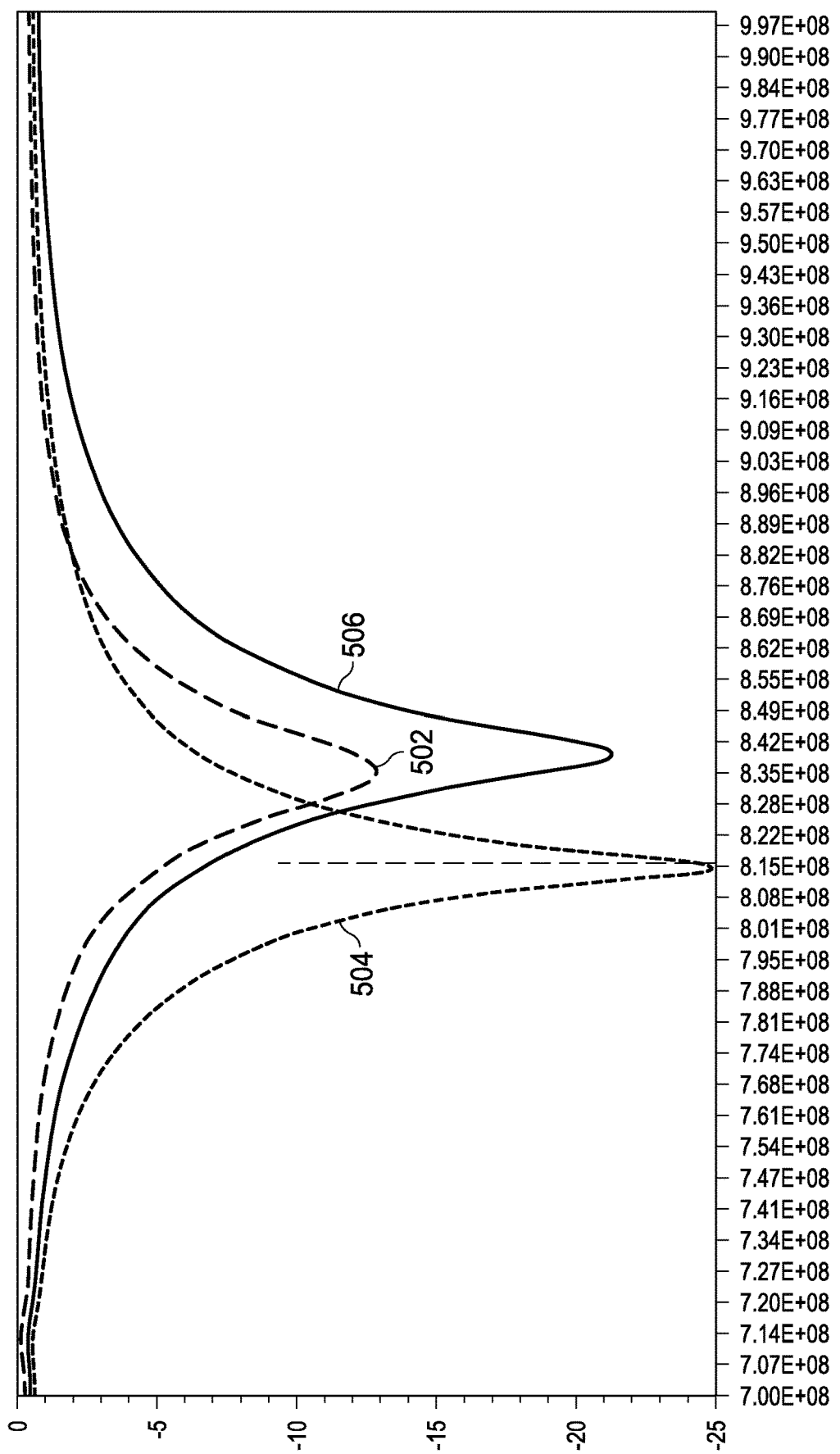
FIG. 5 illustrates another graph of an antenna's return loss varying with frequencies.

FIG. 5 illustrates a graph of return loss of an antenna of a hand-held communication device varying with respect to frequencies according to one embodiment of the present disclosure. The horizontal axis of FIG. 5 represents frequency and the vertical axis represents return loss of the antenna. Curve 502 shows the return loss of the antenna when the antenna is in free space, and curve 504 shows the return loss of the antenna when the hand-held communication device is held by a hand. As shown, when the device is held by a hand, its antenna's resonance frequency is shifted decreasingly, and consequently, its antenna's mismatch loss increases at its predetermined operating resonance frequency. By tuning a tunable capacitor coupled to the antenna to keep the antenna's total load capacitance to be within a reference capacitance range, the antenna may be tuned to operate at a resonance frequency near its original free space operating resonance frequency, as shown by curve 506.

Figure 6:
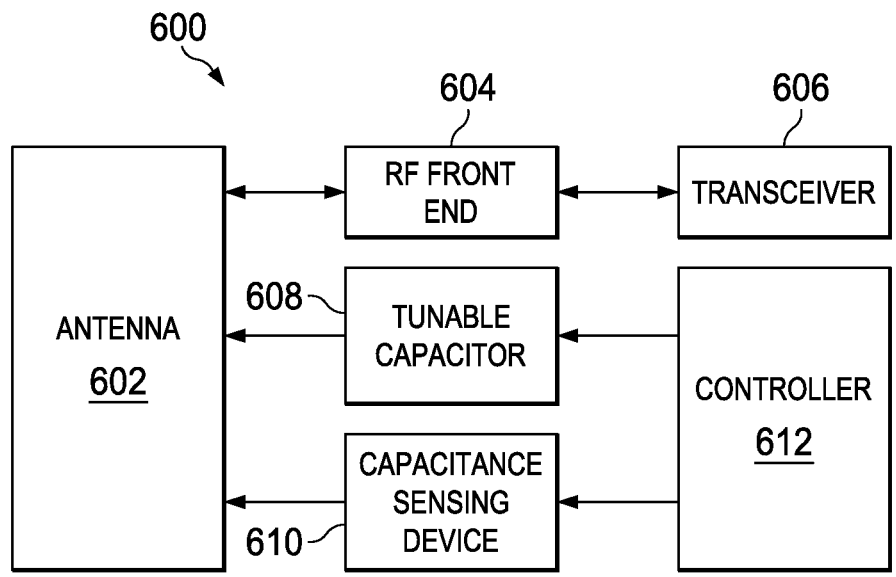
FIG. 6 illustrates a block diagram of an embodiment antenna system.

FIG. 6 illustrates a block diagram of an embodiment antenna system 600 of a hand-held radio communication device. The antenna system 600 includes an antenna 602 coupled to a radio frequency (RF) front end 604. The antenna 602 may be any antenna of which the total load capacitance may be tuned. Examples of the antenna 602 include a left hand (LH) mode antenna, i.e., a metamaterial antenna, a right hand (RH) mode antenna such as an inverted-F antenna (IFA), monopole, T-antenna, or planar inverted-F antenna (PIFA), an aperture tunable antenna, and a passive antenna. The antenna 602 may also support other antenna tuning mechanisms such as open loop impedance tuning, or closed loop antenna impedance tuning.

The RF front end 604 includes components that are used to process signals received by the antenna 602 and transmitted to a transceiver 606. The RF front end 604 also receives signals from the transceiver 606 and converts the received signals into RF signals that will be transmitted by the antenna 602. The RF front end 604 is coupled to the transceiver 606. The transceiver 606 functions as a transmitter and receiver for transmitting and receiving electronic signals. The transceiver 606 may operate at half duplex or full duplex. The detailed operations and structures of the RF front end 604 and the transceiver 606 are well known in the art, and hence are not discussed herein.

FIG. 6 also illustrates a tunable capacitor 608 coupled to the antenna 602. The tunable capacitor 608 is used to change the total load capacitance of the antenna 602. The tunable capacitor 608 may be any capacitor which capacitance may be tuned within a tuning range, such as a tunable RF capacitor, a digitally tunable capacitor, or a microelectromechanical (MEM) system variable capacitor. In one embodiment, the tunable capacitor 608 may have a tuning range that can accommodate the maximum human load capacitance that may be loaded to the antenna 602. The tunable capacitor 608 may also include a plurality of tunable capacitors coupled to each other for achieving a desired capacitance tuning range.

The tunable capacitor 608 may be coupled to the antenna 602 in parallel or in series according to the type of the antenna 602. In accordance with some embodiments, a shunt tunable capacitor 608 may be coupled to the antenna 602 when the antenna 602 is a RH mode antenna. Alternatively, if the antenna 602 is an LH mode antenna, which may be modeled by a circuit including a serial capacitor and a shunt inductor, a serial tunable capacitor 608 may be coupled to the antenna 602. As discussed above, the tunable capacitor 608 is used to tune the total load capacitance of the antenna 602 so that the total load capacitance may remain within a reference capacitance range, and consequently, the antenna 602 is tuned to operate at a resonance frequency that is at or near its operating resonance frequency. In one embodiment, a tunable capacitor 608 may be coupled between the feed of the antenna 602 and a high impedance point of the antenna 602, so that a balance between tunability and linearity and/or power handling may be achieved. If the antenna 602 includes multiple antenna branches, and each is operating at a different pre-determined resonance frequency, then the tunable capacitor 608 may be coupled between the feed of the antenna 602 and a particular antenna branch whose resonance frequency is to be tuned. In one embodiment, the tunable capacitor 608 may be an external capacitor coupled to the antenna 602. Alternatively, the tunable capacitor 608 may be integrated with the antenna 602 with a tuning mechanism for tuning its capacitance.

The antenna system 600 further includes a capacitance sensing device 610, coupled to the antenna 602 and a controller 612. The capacitance sensing device 610 is configured to detect or measure the total load capacitance of the antenna 602. The capacitance sensing device 610 may be a capacitive sensor such as a capacitance sensor or a capacitive proximity sensor. In accordance with some embodiments, the capacitance sensing device 610 may include one or more sensing circuits, such as one or more sensors, or sensor heads (e.g., electrodes or probes), for sensing the capacitance of a target, and a capacitance measurement and processing circuit for determining the capacitance of the target. In one embodiment, the capacitance sensing device 610 may have a single-ended capacitive sensor head. Alternatively, the capacitance sensing device 610 may have a pair of differential capacitive sensor heads. The capacitance sensing devices 610, or a sensing circuit of the capacitance sensing device 610, such as a capacitive sensor head, may be placed where it may detect the capacitance loading of a part of a human body to the antenna 602. If the antenna 602 has multiple parasitic radiation arms, separate capacitance sensing devices 610 or separate sensor heads may be placed for or coupled to each of the parasitic radiation arms for capacitance detection of the respective parasitic radiation arms.

In accordance with some embodiments, two sensor heads of the capacitance sensing device 610 with same shape and slightly different size may be used to detect capacitance of the antenna 602 using a differential capacitance detection configuration, where capacitance between the two sensor heads is detected. In one embodiment, sensor heads with the same shape of the antenna 602 may be placed overlapping to the antenna 602, and connected differentially to the capacitance sensing device 610.

In accordance with some other embodiments, the antenna 602 may also be configured to function as one of two capacitance sensor heads for detecting its total load capacitance using a differential capacitance detection configuration. In this case, an additional capacitor may be used to create DC blocking between the antenna 602 and the ground and between the antenna 602 and the antenna feed. For example, the antenna 602 may be connected to a DC block capacitor which is further coupled to the ground. The antenna 602 may be connected to the antenna feed of the antenna 602 with a serial capacitor functioning as either a DC block or matching capacitor, and is used as one of the sensor heads of the capacitance sensing device 610. Another sensor head with same shape as the antenna 602 may be placed to overlap with the antenna 602, thus eliminating the impact of coupling a capacitance sensing device on the performance of the antenna 602.

In accordance with yet other embodiments, the antenna 602 may be connected to a DC block capacitor that is coupled to the ground and the antenna feed of the antenna 602, and function as a sensor head of the capacitive sensing devices 610 by use of a single-ended capacitance detection configuration, where capacitance between the sensor head, i.e., the antenna 602, and the virtual ground is detected. In this case, an inductor may be used to choke RF signals leaking into the capacitance sensing device 610.

For a differential capacitive sensing configuration, two sensor heads of the capacitive sensing device 610 function as two electrodes of a capacitor. In accordance with some embodiments, the capacitor may be placed in a bridge circuit and its capacitance is read by use of the voltage-current relationship. For detecting the total load capacitance of an antenna tuned with a shunt tunable capacitance to the ground, both the single-ended and differential capacitance detection configurations may be used. For tuning of a left hand antenna, where a tunable capacitor is placed in serial between a feeding branch and a radiating pad of the left hand antenna, the capacitance load between the feeding branch and the radiating pad may be measured. In this case, a differential capacitance measurement configuration may be used. The detailed operation and structure of a capacitance sensing device 610 are well known in the art, and hence are not discussed herein. One of ordinary skill in the art would recognize many variations, alternatives and modifications for implementing the capacitance sensing device 610 for detecting capacitance of an antenna.

The controller 612 is configured to obtain information about the total load capacitance of the antenna 602, and control the tuning of the tunable capacitor 608 according to the detected total load capacitance and a reference capacitance $C_{ref}$, so that the total load capacitance of the antenna 602 falls within a reference capacitance range ($C_{ref}-\Delta c$, $C_{ref}+\Delta c$) of the reference capacitance $C_{ref}$. As described above, the reference capacitance $C_{ref}$ is a pre-determined capacitance value for an antenna, and the antenna operates at its pre-determined operating resonant frequency when the total load capacitance of the antenna equals the reference capacitance in free space. The reference capacitance depends on antenna design and how antenna is modeled. The reference capacitance may be different for different types of antennas, and may also vary with respect to frequency bands and operating modes that an antenna may support. A reference capacitance may be pre-stored in a memory and retrieved when needed. For example, a reference capacitance may be selected from a band table stored in a memory. Further, as discussed above, the maximum acceptable capacitance difference $\Delta c$ may be selected so that when the total load capacitance of the antenna 602 is within the reference capacitance range, the antenna may operate at a resonance frequency that is at or near the antenna's operating resonance frequency. Alternatively, the reference capacitance range of the reference capacitance may be represented by ($C_{ref1}$, $C_{ref2}$), where $C_{ref1}$ and $C_{ref2}$ are the minimum and maximum capacitances of the reference capacitance range, and $C_{ref1} < C_{ref} < C_{ref2}$. Likewise, the $C_{ref1}$ and $C_{ref2}$ may also be pre-determined and stored in a memory, and the $C_{ref1}$ and $C_{ref2}$ may be selected so that when the total load capacitance of the antenna is within the reference capacitance range, the antenna may operate at a resonance frequency that is at or near the antenna's pre-determined operating resonance frequency. The difference between the reference capacitance $C_{ref}$ and the detected total load capacitance value indicates how much the tunable capacitor should be tuned. The controller 612 may further be configured to determine a tuning capacitance according to the detected total load capacitance and the reference capacitance $C_{ref}$. The tuning capacitance is a capacitance value that the tunable capacitor 608 will be tuned to. In one embodiment, the controller 612 may calculate a tuning capacitance according to the detected total load capacitance and the reference capacitance. Alternatively, tuning capacitances corresponding to different detected total load capacitance values may be pre-calculated and stored in a memory, and the controller 612 may find the corresponding tuning capacitance of a detected total load capacitance by searching in the memory.

In accordance with some embodiments, the controller 612 may be a processor, such as a microprocessor or a microcontroller, configured to control the tuning of the tunable capacitor 608 by use of a capacitance tuning circuit. Alternatively, the controller 612 may include a processor and a capacitance tuning circuit by which the capacitance of the tunable capacitor 608 is tuned. For example, the capacitance tuning circuit may be a high voltage digital-to-analog converter (HVDAC) which generates capacitor tuning voltages, and by controlling the capacitor tuning voltages, the tunable capacitor 608 is tuned to a desired capacitance. Another example of capacitance tuning circuit may be a switch or a switch array configured to switch on and off fixed capacitors either in a discrete form or an integrated form. One of ordinary skill in the art would recognize many variations, alternatives and modifications for implementing the capacitance tuning circuit.

Figure 7:
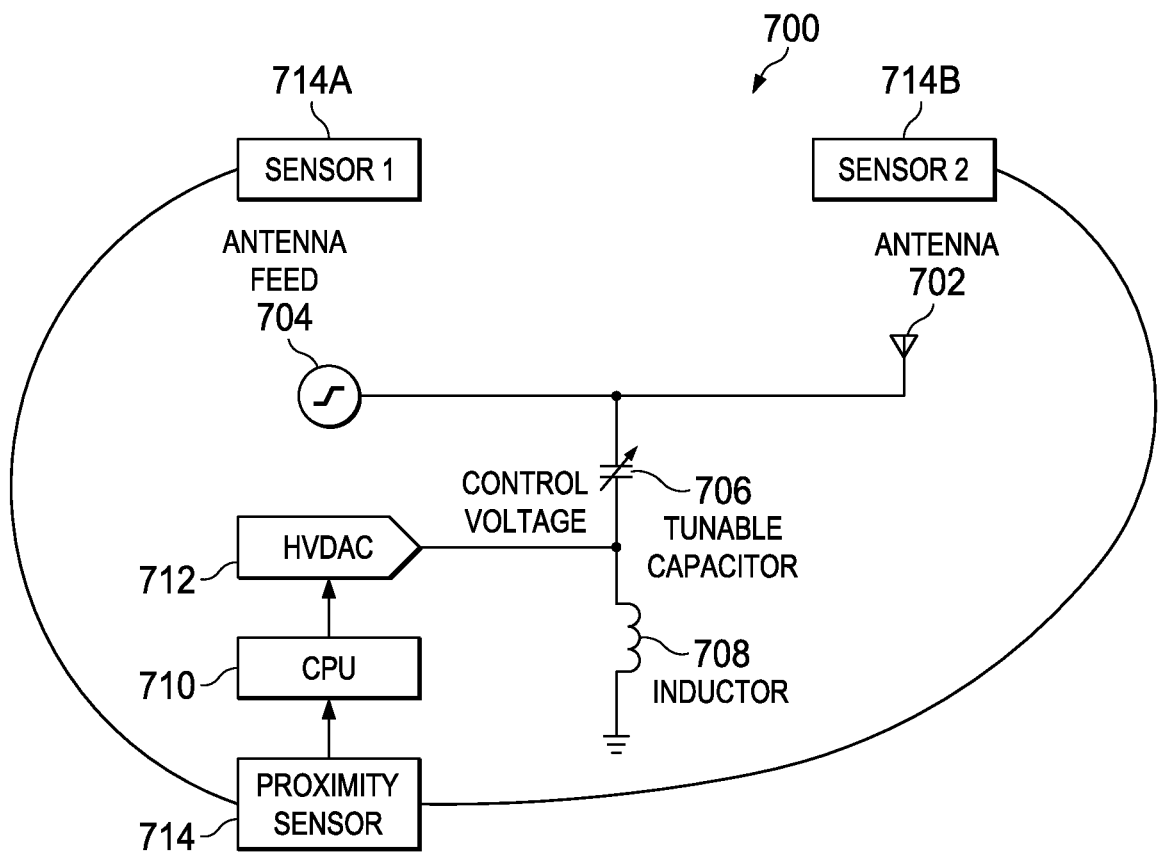
FIG. 7 illustrates a schematic diagram of an embodiment antenna system.

FIG. 7 illustrates a schematic diagram of an embodiment antenna system 700. The antenna system 700 includes an antenna 702 coupled to its antenna feed 704. A tunable capacitor 706 has its first terminal coupled between the antenna 702 and the antenna feed 704. A second terminal of the tunable capacitor 706 is coupled to an inductor 708 in series, which is further coupled to the ground. Alternatively, the inductor 708 could be bypassed, or swapped with the tunable capacitor 706 in placement. A central processing unit (CPU) 710 is coupled to an HVDAC 712 by which the CPU 710 controls the capacitance tuning of the tunable capacitor 706. A capacitive proximity sensor 714 is coupled to the CPU 710 for detecting and providing the detected total load capacitance of the antenna 702. The capacitive proximity sensor 714 includes two sensor heads 714A and 714B for sensing the total load capacitance of the antenna 702. The two sensor heads 714A and 714B may be positioned at a spot where they may sense the total load capacitance change of the antenna 702 when a part of a human body approaches or contacts the antenna 702. The two sensor heads 714A and 714B in this embodiment have same shape and are placed to overlap the antenna 702 in order to reduce the impact of the proximity sensor 714 on the antenna 702 to the minimum.

Figures 8, 9:
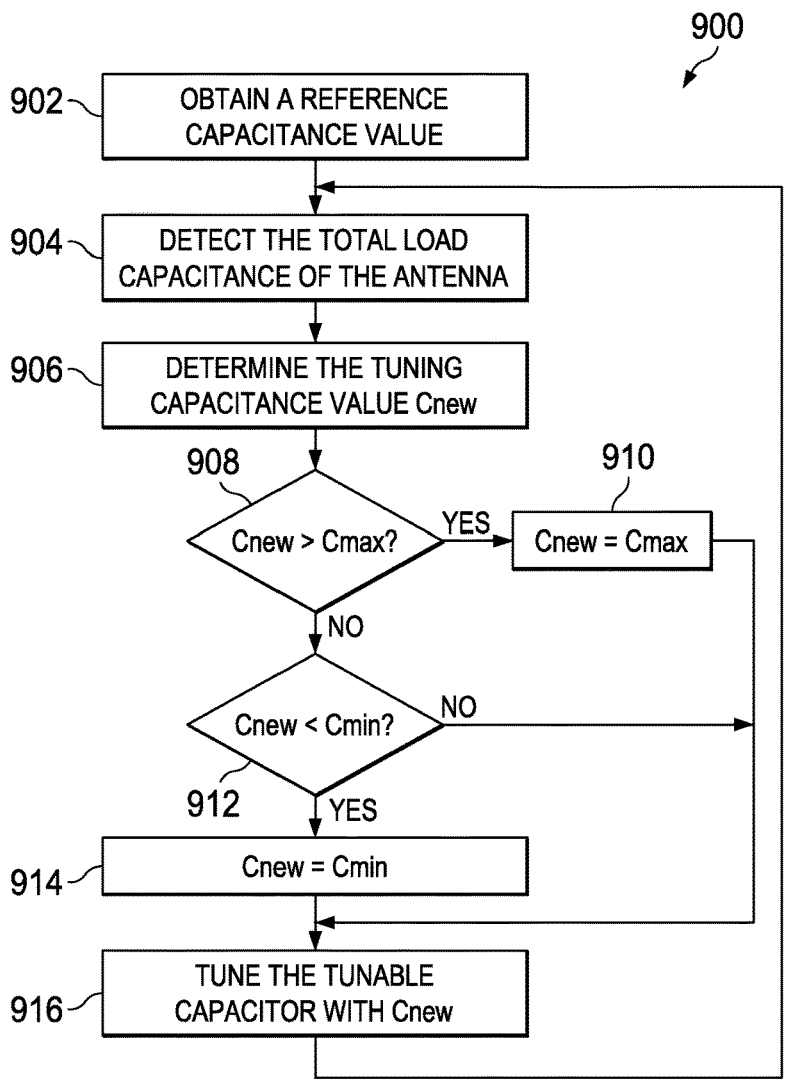
FIG. 8 illustrates an embodiment look-up table for determining a tuning capacitance.
FIG. 9 illustrates a flow chart of an embodiment method for determining a tuning capacitance.

FIG. 8 illustrates an embodiment look-up table 800 for determining a tuning capacitance for the tunable capacitor of the antenna system 600. The look-up table 800 includes a number of total load capacitance values $C_{nx}$ of the antenna 602 and a number of tuning capacitance values $C_{new}$, and each $C_{nx}$ is corresponding to a $C_{new}$. The first column of the look-up table 800 is a state number 1 to N, each indicating a pair of capacitance values, i.e., a $C_{nx}$ and a corresponding $C_{new}$. There are N pairs of such capacitance values in the look-up table 800. The second column of the table 800 includes N discrete values of the total load capacitance, which may include possible values from the smallest to the greatest of the total load capacitance of the antenna that may be detected when the antenna is in free space and having interactions with a part of a human body. The third column of the table 800 includes N tuning capacitance values corresponding to the N total load capacitance values. In accordance with some embodiments, the N total load capacitance values may be pre-determined by measuring the total load capacitance of the antenna 602 when the antenna 602 is loaded through different interactions between a part of a human body and the hand-held radio communication device, consequently with the antenna 602. The N tuning capacitance values may then be calculated according to the detected capacitance values and a reference capacitance value. A look-up table may then be generated comprising the measured total load capacitance values and the corresponding tuning capacitance. In accordance with some embodiments, measured raw data of the total load capacitance of an antenna, instead of the converted capacitance $C_{nx}$, is used in the look-up table. In accordance with some other embodiments, the configurations or states of a tunable capacitor, instead of the tuning capacitance values $C_{new}$, may also be used in the look-up table. The look-up table 800 may be pre-determined and stored in a non-volatile memory of the hand-held radio communication device at the time of production. Separate look-up tables 800 may be generated for different antennas.

The interactions between a part of a human body and the antenna may have different effect on the total load capacitance of the antenna when the antenna is operating at different resonance frequencies, frequency bands or modes. For example, a smart phone may support multi-modes such as LTE frequency division duplexing (FDD), LTE time division duplexing (TDD), universal mobile telecommunications system (UMTS) circuit switched fallback (CSFB) FDD, and UMTS CSFB TDD, and with respect to each mode, the smart phone may operate at multiple frequency bands. In accordance with some embodiments, for an antenna supporting multi-mode and multi-band, a plurality of look-up tables may be generated, and each of the look-up tables is corresponding to a mode and a frequency band that the antenna is supporting. The plurality of look-up tables may be indexed by the mode and frequency band of the antenna. In accordance with some embodiments, if an antenna uses switches to switch its operating resonance frequency, a separate look-up table may be generated for each of the operating resonance frequencies that the antenna may use, since the reference capacitance and the total load capacitance vary with the antenna's operating resonance frequencies. If switch states are used to indicate the resonance frequency switching, the switch states may also be used to index the look-up tables. Moreover, certain use cases of a hand-held communication device may be detected using various sensors, and the use cases may also be used to index the look-up tables to speed up the search of the look-up tables. One of ordinary skill in the art would recognize many variations, alternatives and modifications for arranging and indexing the look-up tables.

With such look-up tables built up, when the controller 612 obtains a total load capacitance detected by the capacitance sensing device 610, the controller 612 may search the look-up tables according to the detected total load capacitance and other information that may affect the total load capacitance of the antenna, such as the frequency band, the operating mode and the switch state at which the antenna is operating, and the use case of the hand-held communication device, select a tuning capacitance corresponding to the detected total load capacitance in a corresponding look-up table, and tune the tunable capacitor 608 to the tuning capacitance.

FIG. 9 illustrates another embodiment method 900 for determining a tuning capacitance for the tunable capacitor 608 in FIG. 6. The method 900 starts from obtaining a reference capacitance value $C_{ref}$ at step 902, and continues to detecting or measuring a total load capacitance of the antenna 602 at step 904. The method 900 then determines the tuning capacitance for tuning the tunable capacitor 608 according to the detected total load capacitance value and the reference capacitance value $C_{ref}$. In one embodiment, a tuning capacitance value may be calculated by the controller 612. For example, a capacitance reading from a sensor of the capacitance sensing device 610 may first be adjusted by: $C_x=(C_{xm}-C_b)*k_0$, where $C_{xm}$ is the capacitance reading, $C_b$ is a baseline capacitance of the capacitance sensing device 610, $k_0$ is a scale factor and $C_x$ is the adjusted result of the capacitance reading. The adjusted result is used to calculate a capacitance difference $C_d'$ with respect to the reference capacitance value $C_{ref}$ by: $C_d'=C_x-C_{ref}$. The capacitance difference $C_d'$ is then filtered by a low-pass filter and used to calculate a tuning capacitance value $C_{new}$ as follows: $C_d=LPF(C_d')$ and $C_{new}=C_{old}+k*C_d$, where LPF represents low-pass filtering, $C_{old}$ is the present capacitance value of the tunable capacitor 608, $C_{new}$ is the tuning capacitance calculated, and k is a tuning factor, which is used to control the tuning speed so that the phase change of the antenna 602 resulted from the tuning may not disrupt decoding of signals. In one embodiment, to avoid abrupt phase changes of the tuning antenna 602, a maximum capacitance change ($C_{limit}>0$) may be defined for each tuning step, so that:

$$C_{new}=C_{old}+C_d \text{ if } abs(C_d)<C_{limit}$$

$$C_{new}=C_{old}+C_{limit} \text{ if } C_d>C_{limit}$$

$$C_{new}=C_{old}-C_{limit} \text{ if } C_d<-C_{limit}$$

One of ordinary skill in the art would recognize many variations, alternatives and modifications for calculating the tuning capacitance used to tune the tunable capacitor 608.

The method 900 determines whether the calculated tuning capacitance $C_{new}$ is within the capacitance tuning range of the tunable capacitor 608. If the calculated capacitance $C_{new}$ is greater than a maximum tunable capacitance value $C_{max}$ of the tuning range at step 908, the $C_{max}$ is set to be the tuning capacitance at step 910, since $C_{max}$ is the maximum capacitance value that the tunable capacitor 608 may be tuned, and the method goes to step 916, where the tuning capacitance is used to tune the tunable capacitor 608. If the calculated capacitance $C_{new}$ is less than the maximum tunable capacitance value $C_{max}$ at step 908, the method 900 goes to step 912. At step 912, the method 900 compares the calculated tuning capacitance $C_{new}$ with a minimum tunable capacitance value $C_{min}$ of the capacitance tuning range. If $C_{new}$ is less than $C_{min}$, then the $C_{min}$ is set to be the tuning capacitance at step 914, and the method goes to step 916. If $C_{new}$ is not less than $C_{min}$ at step 912, then the calculated tuning capacitance is used as the tuning capacitance to tune the tunable capacitor 608 at step 916. The method 900 may also be used for aperture tuning with respect to each switching state of an antenna if the antenna supports frequency switching.

Figure 10:
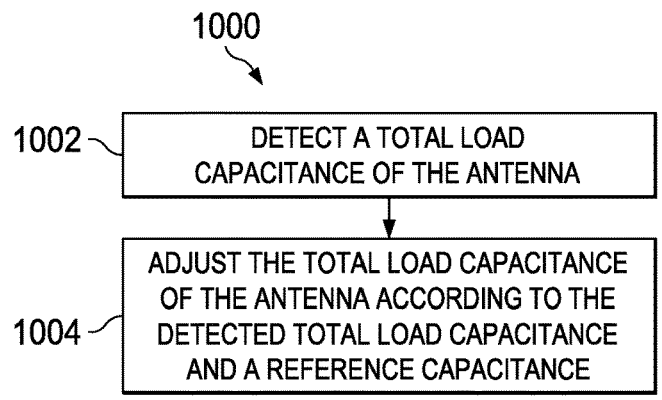
FIG. 10 illustrates a flow chart of an embodiment method of adaptive aperture tuning of an antenna.

FIG. 10 illustrates an embodiment method 1000 of adaptive aperture tuning of an antenna. The method 1000 starts with detecting the total load capacitance of the antenna at step 1002. In one embodiment, a capacitance sensing device may be coupled to the antenna for detecting the total load capacitance. The method 1000 continues at step 1004 to change the total load capacitance of the antenna according to the detected total load capacitance of the antenna and a reference capacitance so that the total load capacitance of the antenna is within a reference capacitance range of the reference capacitance. In accordance with some embodiments, the total load capacitance of the antenna may be changed by tuning a tunable capacitor coupled to the antenna. As discussed above, the tunable capacitor may be a shunt or a serial tunable capacitor. In accordance with some embodiments, the method 1000 may determine a tuning capacitance for tuning the tunable capacitor. For example, the method 1000 may select a tuning capacitance by searching a plurality of pre-generated look-up tables, each of which includes a number of tuning capacitance values and a number of total load capacitance values of the antenna. Each of the tuning capacitance is corresponding to a total load capacitance value. Alternatively, the method 1000 may calculate a tuning capacitance for tuning the tunable capacitor according to the detected total load capacitance and a reference capacitance. The method 1000 may also determine whether the calculated tuning capacitance is within the tuning range of the tunable capacitor, and set the tuning capacitance to be a maximum tunable capacitance of the tunable capacitor if the calculated tuning capacitance is greater than the maximum tunable capacitance. The method 1000 may further set the tuning capacitance to be a minimum tunable capacitance of the tunable capacitor if the calculated tuning capacitance is less than the minimum tunable capacitance.

Figure 11:
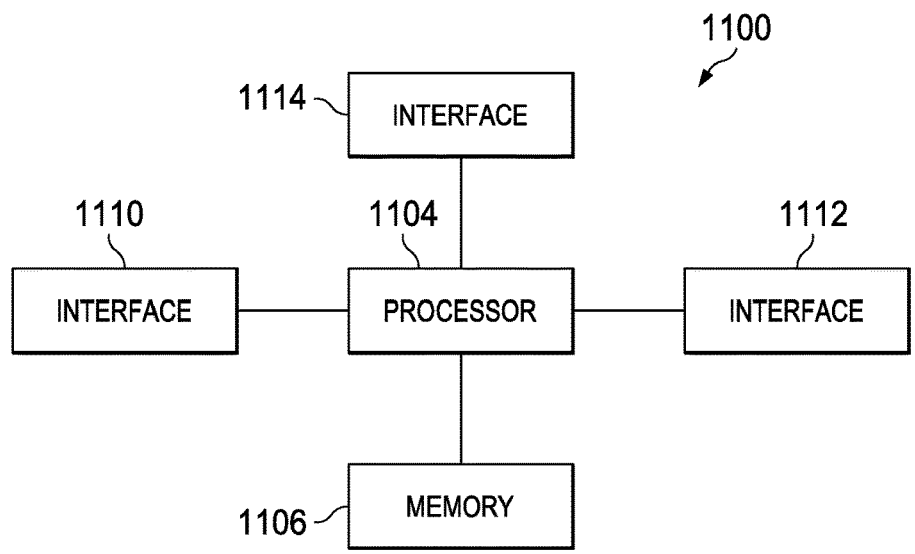
FIG. 11 illustrates a block diagram of an embodiment processing system.

FIG. 11 illustrates a block diagram of an embodiment processing system 1100 for performing methods described herein, which may be installed in a host device. As shown, the processing system 1100 includes a processor 1104, a memory 1106, and interfaces 1110-1114, which may (or may not) be arranged as shown in FIG. 11. The processor 1104 may be any component or collection of components adapted to perform computations and/or other processing related tasks, and the memory 1106 may be any component or collection of components adapted to store programming and/or instructions for execution by the processor 1104. In an embodiment, the memory 1106 includes a non-transitory computer readable medium. The interfaces 1110, 1112, 1114 may be any component or collection of components that allow the processing system 1100 to communicate with other devices/components and/or a user. For example, one or more of the interfaces 1110, 1112, 1114 may be adapted to communicate data, control, or management messages from the processor 1104 to applications installed on the host device and/or a remote device. As another example, one or more of the interfaces 1110, 1112, 1114 may be adapted to allow a user or user device (e.g., personal computer (PC), etc.) to interact/communicate with the processing system 1100. The processing system 1100 may include additional components not depicted in FIG. 11, such as long term storage (e.g., non-volatile memory, etc.).

In some embodiments, the processing system 1100 is in a user-side device accessing a wireless telecommunications network, such as a mobile station, a user equipment (UE), a tablet, a wearable communications device (e.g., a smart-watch, etc.), or any other device adapted to access a wireless telecommunications network.

Figure 12:
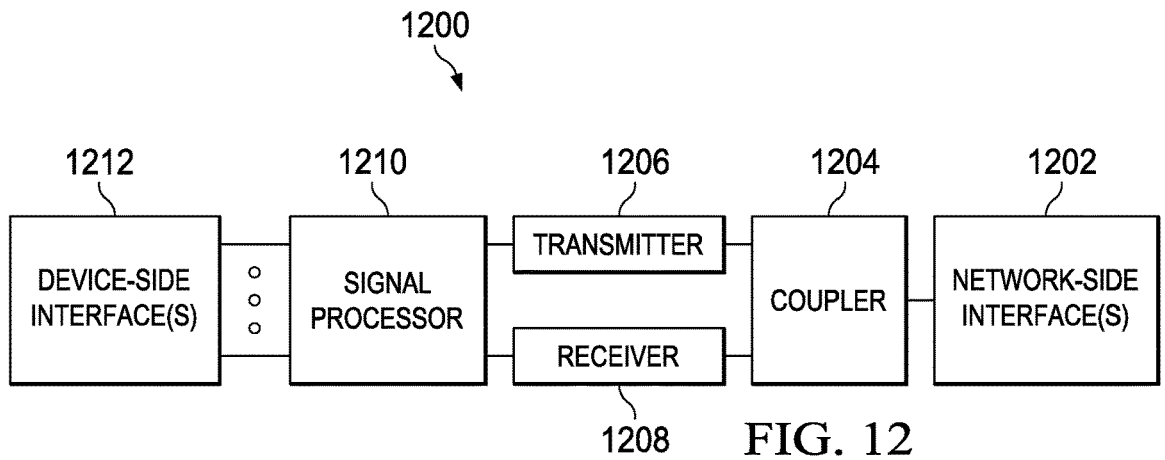
FIG. 12 illustrates a block diagram of a transceiver adapted to transmit and receive signaling over a telecommunications network.

In some embodiments, one or more of the interfaces 1110, 1112, 1114 connects the processing system 1100 to a transceiver adapted to transmit and receive signaling over the telecommunications network. FIG. 12 illustrates a block diagram of a transceiver 1200 adapted to transmit and receive signaling over a telecommunications network. The transceiver 1200 may be installed in a host device. As shown, the transceiver 1200 comprises a network-side interface 1202, a coupler 1204, a transmitter 1206, a receiver 1208, a signal processor 1210, and a device-side interface 1212. The network-side interface 1202 may include any component or collection of components adapted to transmit or receive signaling over a wireless telecommunications network. The coupler 1204 may include any component or collection of components adapted to facilitate bi-directional communication over the network-side interface 1202. The transmitter 1206 may include any component or collection of components (e.g., up-converter, power amplifier, etc.) adapted to convert a baseband signal into a modulated carrier signal suitable for transmission over the network-side interface 1202. The receiver 1208 may include any component or collection of components (e.g., down-converter, low noise amplifier, etc.) adapted to convert a carrier signal received over the network-side interface 1202 into a baseband signal. The signal processor 1210 may include any component or collection of components adapted to convert a baseband signal into a data signal suitable for communication over the device-side interface(s) 1212, or vice-versa. The device-side interface(s) 1212 may include any component or collection of components adapted to communicate data-signals between the signal processor 1210 and components within the host device (e.g., the processing system 1100, local area network (LAN) ports, etc.).

The transceiver 1200 may transmit and receive signaling over any type of communications medium. In some embodiments, the transceiver 1200 transmits and receives signaling over a wireless medium. For example, the transceiver 1200 may be a wireless transceiver adapted to communicate in accordance with a wireless telecommunications protocol, such as a cellular protocol (e.g., long-term evolution (LTE), etc.), a wireless local area network (WLAN) protocol (e.g., Wi-Fi, etc.), or any other type of wireless protocol (e.g., Bluetooth, near field communication (NFC), etc.). In such embodiments, the network-side interface 1202 comprises one or more antenna/radiating elements. For example, the network-side interface 1202 may include a single antenna, multiple separate antennas, or a multi-antenna array configured for multi-layer communication, e.g., single input multiple output (SIMO), multiple input single output (MISO), multiple input multiple output (MIMO), etc. Specific processing systems and/or transceivers may utilize all of the components shown, or only a subset of the components, and levels of integration may vary from device to device.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. An apparatus, comprising:
    an antenna having a tunable aperture;
    a tunable capacitor, a first terminal of the tunable capacitor being coupled to the antenna, and a second terminal of the tunable capacitor being coupled to a ground through an inductor;
    a capacitance sensing device coupled to the antenna, and configured to detect a total load capacitance of the antenna, the capacitance sensing device including a sensor head that is positioned overlapping the antenna; and
    a controller, coupled to the capacitance sensing device, and configured to select, from a plurality of look-up tables, a tuning capacitance of the tunable capacitor that is associated with the total load capacitance of the antenna based on a frequency band, a resonant frequency, and a duplexing mode that the antenna is operating at, and to control tuning of the tunable capacitor in accordance with the selected tuning capacitance, the selected tuning capacitance of the tunable capacitor having been predefined to tune the total load capacitance of the antenna to fall within a reference capacitance range of a reference capacitance, the reference capacitance enabling the antenna to operate at the resonant frequency.

2. The apparatus of claim 1, wherein the antenna comprises a metamaterial antenna or a passive antenna.

3. The apparatus of claim 1, wherein the capacitance sensing device comprises a capacitor sensor.

4. The apparatus of claim 1, wherein the capacitance sensing device comprises a capacitive proximity sensor.

5. The apparatus of claim 1, wherein the capacitance sensing device is configured to detect the total load capacitance of the antenna using a differential capacitance detection technique or a single-ended capacitance detection technique.

6. The apparatus of claim 1, wherein the tunable capacitor comprises a shunt tunable capacitor or a serial tunable capacitor.

7. The apparatus of claim 1, wherein each of the look-up tables comprises a number of total capacitance values of the antenna, and each of the number of total capacitance values of the antenna corresponds to a predetermined tuning capacitance value to which the tunable capacitor is tuned for the total load capacitance of the antenna to fall within the reference capacitance range of the reference capacitance.

8. The apparatus of claim 1, wherein the plurality of look-up tables are predetermined, each of the plurality of look-up tables corresponding to different frequency band(s) that the antenna supports.

9. The apparatus of claim 1, wherein the controller is further configured to determine whether the selected tuning capacitance is within a tuning range of the tunable capacitor, the tuning range including a range of capacitance values between a maximum capacitance value and a minimum capacitance value.

10. The apparatus of claim 9, wherein the controller is further configured to:
    in response to determining that the selected tuning capacitance is greater than the maximum capacitance value of the tuning range, select the maximum capacitance value as the tuning capacitance to be used for tuning the tunable capacitor.

11. The apparatus of claim 9, wherein the controller is further configured to:
    in response to determining that the selected tuning capacitance is less than the minimum capacitance value of the tuning range, select the minimum capacitance value as the tuning capacitance to be used for tuning the tunable capacitor.

12. The apparatus of claim 1, further comprising a capacitance tuning circuit for tuning the tunable capacitor under control of the controller.

13. A method for tuning an antenna of an apparatus, the method comprising:
   detecting, via a capacitance sensing device of the apparatus, a total load capacitance of the antenna, the capacitance sensing device including a sensor head that is positioned overlapping the antenna, the antenna having a tunable aperture and being coupled to a tunable capacitor of the apparatus, the tunable capacitor coupled to ground through an inductor;
   selecting, by a controller of the apparatus from a plurality of look-up tables, a tuning capacitance of the tunable capacitor that is associated with the total load capacitance of the antenna based on a frequency band, a resonant frequency, and a duplexing mode that the antenna is operating at, the selected tuning capacitance of the tunable capacitor having been predefined to tune the total load capacitance of the antenna to fall within a reference capacitance range of a reference capacitance, the reference capacitance enabling the antenna to operate at the resonant frequency; and
   controlling, by the controller of the apparatus, tuning of the tunable capacitor according to the selected tuning capacitance.

14. The method claim 13, wherein each of the plurality of look-up tables are predetermined for the antenna.

15. The method of claim 14, wherein each of the plurality of look-up tables corresponds to different frequency band(s) that the antenna supports.

16. The method of claim 14, wherein each of the plurality of look-up tables corresponds to different resonance frequency(s) at which the antenna operates.

17. The method of claim 13, further comprising determining whether the selected tuning capacitance is within a tuning range of the tunable capacitor, the tuning range including a range of capacitance values between a maximum capacitance value and a minimum capacitance value.

18. The method of claim 17, further comprising:
   in response to determining that the selected tuning capacitance is greater than the maximum capacitance value, selecting the maximum capacitance value as the tuning capacitance for tuning the tunable capacitor.

19. The method of claim 17, further comprising:
   in response to determining that the selected tuning capacitance is less than the minimum capacitance value, selecting the minimum capacitance value as the tuning capacitance for tuning the tunable capacitor.

20. The method claim 13, wherein the capacitance sensing device detects the total load capacitance of the antenna using a capacitor sensor.

21. The method claim 13, wherein the capacitance sensing device detects the total load capacitance of the antenna using a capacitive proximity sensor.

22. The method claim 13, wherein the antenna comprises a metamaterial antenna or a passive antenna.

23. The method of claim 13, wherein the apparatus further includes a capacitance tuning circuit for tuning the tunable capacitor under control of the controller.

\* \* \* \* \*